US008703391B1

(12) United States Patent  
Dirk et al.

(10) Patent No.: US 8,703,391 B1  
(45) Date of Patent: Apr. 22, 2014

(54) POLYMERIC MATRIX MATERIALS FOR INFRARED METAMATERIALS

(75) Inventors: Shawn M. Dirk, Albuquerque, NM (US); Roger D. Rasberry, Albuquerque, NM (US); Kamyar Rahimian, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 143 days.

(21) Appl. No.: 13/305,837

(22) Filed: Nov. 29, 2011

(51) Int. Cl.
G03F 7/26 (2006.01)

(52) U.S. Cl.
USPC .......................................... 430/311; 430/322

(58) Field of Classification Search
USPC ...................... 430/322, 311, 270.1
See application file for complete search history.

(56) References Cited

U.S. PATENT DOCUMENTS

| | | | |
|---|---|---|---|
| 6,451,499 B1 * | 9/2002 | Jayaraman et al. | 430/270.1 |
| 2003/0207958 A1 * | 11/2003 | Smith et al. | 522/173 |
| 2003/0236367 A1 * | 12/2003 | Choi et al. | 526/169.1 |
| 2006/0155078 A1 * | 7/2006 | Choi et al. | 525/333.7 |
| 2009/0176941 A1 * | 7/2009 | David et al. | 525/333.2 |

OTHER PUBLICATIONS

A. Boltasseva, V.M. Shalaev, Fabrication of Optical Negative-Index Metamaterials: Recent Advances and Outlook, ScienceDirect Metamaterials 2 (2008) 1-17.
W.R. Folks, et al., Spectroscopic Ellipsometry of Materials for Infrared Micro-Device Fabrication, Phys. Stat. Sol. (c) 5, No. 5 pp. 1113-1116 (2008).
J.C. Ginn, et al., Realizing Optical Magnetism from Dielectric Metamaterials, OSA Technical Digest, Optical Society of America, Tuczon, AZ, p. MWD2 (2010).
C.L. Holloway, A Double Negative (DNG) Composite Medium Composed of Magnetodielectric Spherical Particles Embedded in a Matrix, IEEE Transactions on Antennas and Propagation, vol. 51, No. 10, Oct. 2003, pp. 2596-2603.
C.E. Hoyle, C.N. Bowman, Thiol-Ene Click Chemistry, Angew. Chem. Int. Ed. 2010, 49, pp. 1540-1573.
L. Lewin, The Electrical Constants of a Material Loaded with Spherical Particles, Proc. Inst. Electr. Eng. 94, 65 (1947).
L.A. Mango, R.W. Lenz, Hydrogenation of Unsaturated Polymers with Diimide, Die Makromolekulare Chemie 163 (1973) pp. 13-36.
D.J. Shelton, et al., Strong Coupling between Nanoscale Metamaterials and Phonons, Nano Letters, 2011, 11, pp. 2104-2108.
I. Vendik, et al., Modelling of Isotropic Double Negative Media for Microwave Applications, Opto-Electronics Review, 14, No. 3, 2006, pp. 179-186.
Q. Zhao, et al., Mie Resonance-Based Dielectric Metamaterials, MaterialsToday, Dec. 2009, vol. 12, No. 12, pp. 60-69.
Q. Zhao, et al., Experimental Demonstration of Isotropic Negative Permeability in a Three-Dimensional Dielectric Composite, Physical Review Letters, 101, 027402 (2008), pp. 027402-1-027402-4.

* cited by examiner

Primary Examiner — Cynthia Kelly
Assistant Examiner — Caleen Sullivan
(74) Attorney, Agent, or Firm — Kevin W. Bieg

(57) ABSTRACT

A polymeric matrix material exhibits low loss at optical frequencies and facilitates the fabrication of all-dielectric metamaterials. The low-loss polymeric matrix material can be synthesized by providing an unsaturated polymer, comprising double or triple bonds; partially hydrogenating the unsaturated polymer; depositing a film of the partially hydrogenated polymer and a crosslinker on a substrate; and photopatterning the film by exposing the film to ultraviolet light through a patterning mask, thereby cross-linking at least some of the remaining unsaturated groups of the partially hydrogenated polymer in the exposed portions.

10 Claims, 7 Drawing Sheets

POLYMERIC MATRIX MATERIALS FOR INFRARED METAMATERIALS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to infrared metamaterials and, in particular, the use of low-loss polymeric matrix materials for infrared metamaterials.

BACKGROUND OF THE INVENTION

Metamaterials are artificially-structured resonant materials which manipulate the flow of electromagnetic energy to afford properties that are not typically found in naturally occurring materials. See V. G. Veselago, *Soviet Physics Uspekhi-Ussr* 10, 509 (1968); and R. A. Shelby et al., *Science* 292, 77 (2001). For example, electromagnetic cloaking has been demonstrated at microwave frequencies and it is theoretically plausible that the first perfect lens will be constructed entirely of negative refractive index metamaterials. See J. B. Pendry, *Phys. Rev. Lett.* 85, 3966 (2000); and D. Schurig et al., *Science* 314, 977 (2006). So far, most metamaterials have been fabricated using metallic unit cell structures embedded in a dielectric matrix. See T. J. Cui et al., in *Metamaterials Theory, Design, and Applications*, Springer, N.Y., 2010. Though well-suited for low frequency applications (e.g., <1 THz), metals are besieged by high ohmic losses at high frequencies which presents a tremendous challenge for implementing metamaterials that operate at optical frequencies (visible and infrared). See V. M. Shalaev et al., *Opt. Lett.* 30, 3356 (2005); S. Zhang et al, *Phys. Rev. Lett.* 95, 137404 (2005); G. Dolling et al., *Opt. Lett.* 31, 1800 (2006); G. Dolling et al., *Opt. Lett.* 32, 53 (2007); S. P. Burgos et al., *Nat. Mater.* 9, 407 (2010); C. M. Soukoulis et al., *Science* 315, 47 (2007); and V. M. Shalaev, *Nat. Photonics* 1, 41 (2007). Researchers have sought to compensate for ohmic loss with alternative strategies for reducing metamaterial absorption that include the development of gain media and protocols for fabricating 3D metamaterials supporting volumetric energy flow. See S. A. Ramakrishna and J. B. Pendry, *Phys. Rev. B* 67 (2003); S. M. Xiao et al., *Nature* 466, 735 (2010); and D. B. Burckel et al., *Adv. Mater.* 22, 3171 (2010). One straight-forward way to drastically reduce metamaterial loss is to remove the metal completely and replace it with a very low loss dielectric resonator. See L. Lewin, *Proc. Inst. Electr. Eng.* 94, 65 (1947). In this case, the loss contribution of the dielectric matrix material begins to be appreciable compared to the low loss dielectric resonator.

The primary components of an all-dielectric metamaterial are two dielectric resonators which generate negative permittivity ($-\epsilon_{\mathit{eff}}$) and negative permeability ($-\mu_{\mathit{eff}}$) simultaneously. See I. Vendik et al., *Opto-Electron. Rev.* 14, 179 (2006); Q. Zhao et al., *Mater. Today* 12, 60 (2009); C. L. Holloway et al., *IEEE Trans. Antennas Propag.* 51, 2596 (2003); Q. Zhao et al., *Phys. Rev. Lett.* 101 (2008); and J. C. Ginn et al., in *OSA Technical Digest*, Optical Society of America, Tuczon, Ariz., p. MWD2 (2010). At first glance, the importance of the dielectric matrix in these designs appears minimal; serving only as a support for the dielectric resonators. However, metamaterial fabrication is not trivial and the resonant fields of the dielectric resonators which extend into the dielectric matrix material must experience minimal attenuation. See D. J. Shelton et al., *Nano Letters* 11, 2104 (2011).

Therefore, a need remains for a matrix material that exhibits low loss at optical frequencies and facilitates the fabrication of all-dielectric metamaterials. Such a dielectric matrix material would be widely applicable to the fabrication of metal-dielectric metamaterials and a wide range of infrared optical devices as well.

SUMMARY OF THE INVENTION

The present invention is directed to a method of synthesis a low-loss polymeric matrix material for infrared metamaterials, comprising providing an unsaturated polymer comprising double or triple bonds, partially hydrogenating the unsaturated polymer, depositing a film of the partially hydrogenated polymer and a crosslinker on a substrate, and photopatterning the film by exposing the film to ultraviolet light through a patterning mask, thereby cross-linking at least some of the remaining unsaturated groups of the partially hydrogenated polymer in the exposed portions. For example, the unsaturated polymer can be polynorbornene or polybutadiene. Unsaturated polynorbornene can be synthesized by a ring opening metathesis polymerization of norbornene. The step of partially hydrogenating the unsaturated polynorbornene can comprise hydrogenating at least some of the olefin groups of the polynorbornene using tosyl hydrazide as a diimide hydrogenation precursor. The cross-linking can comprise a thiol-ene coupling reaction or a carbon-centered radical-based crosslinker. The thiol-ene coupling reaction can use octanedithiol as a crosslinker and bisacylphosphine as a photoinitiator.

The invention is further directed to an infrared metamaterial comprising a dielectric resonator embedded in a matrix material comprising an at least partially hydrogenated unsaturated polymer that can be crosslinked.

As an example of the present invention, novel low-loss photopatternable polymer dielectric materials were synthesized by partially hydrogenating polynorbornene to varying degrees and using the thiol-ene coupling reaction to cross-link the remaining olefin groups. The material characteristics were measured using FTIR and DMA analysis from free-standing films, and the optical constants of spun-cast films were characterized using IR-VASE. A 1.6 µm thick layer of photopatterned material was demonstrated using the optimum partially hydrogenated polymer (18.2%). An overcoat layer of the low-loss polymer on an alkdielectric, infrared metamaterial had excellent planarization and little impact on the overall loss of the metamaterial. The thermo-mechanical and spectral properties of these matrix materials indicate that they can be used for fabricating long wavelength infrared (LWIR) metamaterials and other applications that require a low loss negative photoresist.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
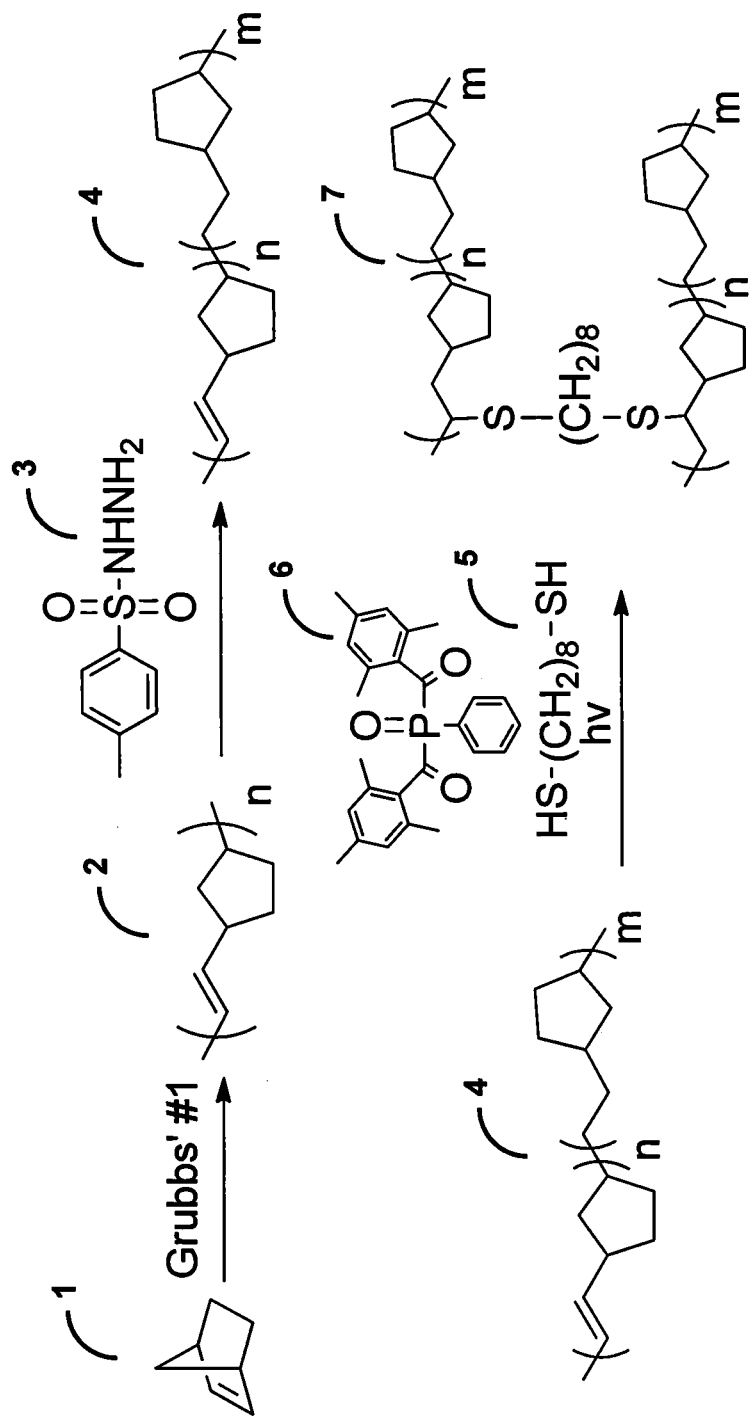
FIG. 1 is a diagram of a synthesis of a low-loss polynorbornene matrix material using a sequence of ring opening metathesis polymerization (ROMP), hydrogenation, and thiol-ene coupling reactions.

Traditionally, low-loss metamaterial surfaces have been fabricated on high-index substrates (silicon, germanium, etc.) to avoid phonon coupling and absorption. See T. J. Cui et al., in *Metamaterials Theory, Design, and Applications*, Springer, N.Y. (2010); W. Cai and V. Shalaev, in *Optical Metamaterials Fundamentals and Applications*, Springer, N.Y. (2010); and N. Engheta and R. W. Siolkowski, eds., in *Metamaterials: Physics and Engineering Explorations*, Wiley-IEEE Press, Piscataway, N.J. (2006). However, high-index materials are not ideal dielectric matrix materials because they lead to significant boundary mismatch losses, induce leakage in dielectric resonators, and increase fabrication difficulty by reducing the electrical length of the metamaterial resonators. These materials are also difficult to incorporate in the 3D constructs and require challenging polishing steps to ensure planarization. Transparent dielectrics are far more attractive but traditional low-index materials such as silicon dioxide, aluminum dioxide, and barium fluoride all exhibit strong phonon absorption modes in the thermal infrared and are equally difficult to planarize for 3D designs. Thus, the ideal dielectric matrix material for LWIR-metamaterial applications would be simultaneously low-loss and low-index, and allow for solution deposition for simple planarization.

Low-loss photopatternable polymer dielectics appear to be a promising solution. However, off-the-shelf commerically available photoresist polymers also exhibit vibrational absorption bands in the optical regime. See W. R. Folks et al., *Phys. Status Solidi* 5, 1113 (2008). An ideal polymer dielectric would have losses comparable to polyethylene but have the additional benefits of a resist in that it is compatible with 3D fabrication techniques, photopatternable, and high temperature process tolerant. See A. Boltasseva and V. M. Shalaev, *Metamaterials* 2, 1 (2008). The present invention is directed to a tunable polymeric matrix material which satisfies each of these requirements in the thermal infrared spectral region (8-12 μm).

An example of the present invention is described below. In this example, unsaturated polynorbornene is synthesized using the ring opening metathesis polymerization (ROMP) of norbornene followed by a partial hydrogenation to remove most of the IR absorbing olefin groups in the 8-12 μm range. Photopatterning of these materials can then be achieved by using the remaining olefin groups to crosslink the exposed partially hydrogenated norbornene via a thiol-ene coupling reaction. After cross-linking, the olefin IR-absorption band is minimized and the $T_g$ of the matrix material increases. Thus, the material is ideal for lithography and fabrication of 3D metamaterial structures operating in the LWIR spectral region. To demonstrate the low-loss nature of the matrix materials, the polymer was incorporated into an all-dielectric, infrared metamaterial. A planarizing layer of partially hydrogenated and cross-linked polynorbornene spun-cast onto etched tellurium cubes had little impact on the overall metamaterial loss.

Polynorbornene Synthesis

A method to synthesize photopatternable polynorbornene is shown in FIG. 1. Polynorbornene 2 can be synthesized using a ring opening metathesis polymerization of norbornene 1 using a Grubbs' catalyst. At least some of the olefin groups of the polynorbornene 2 can be hydrogenated using tosyl hydrazide 3 as a diimide hydrogenation precursor to provide a partially hydrogenated polynorbornene 4. The partially hydrogenated polynorbornene 4 can be cross-linked by a thiol-ene coupling reaction using 1,8-octanedithiol 5 as a crosslinker and bisacylphosphine 6 as a photoinitiator and exposing the partially hydrogenated polynorbornene to ultraviolet light hv to provide a cross-linked polynorbornene 7. For example, the partially hydrogenated polynorbornene 4, crosslinker 5, and photoinitiator 6 can be deposited as a thin film on a substrate and photopatterned by exposing the film to ultraviolet light through a patterning mask, thereby providing the cross-linked polynorbornene 7 in the exposed portions. The photopatterned film can then be developed to remove the unexposed portions.

As an example of a synthesis of polynorbornene, chloroform (400 mL) and norbornene (7.0 g, 74.3 mmol) were added to a 1 L Erlenmeyer flask equipped with a magnetic stir bar and stirred until the norbornene dissolved. Next, Grubbs'#1 (0.0768 g, 0.093 mmol) was dissolved in 5 mL of chloroform and mixed into the solution of norbornene. An additional 100 mL of chloroform was added to the flask immediately after adding the catalyst to prevent gel formation. The reaction mixture was stirred for 90 min. and the catalyst was quenched with ethyl vinyl ether (4.487 mL, 46.7 mmol). Polynorbornene was slowly precipitated into ethanol (5 L), filtered, and washed with additional ethanol. The polymer was dried in vacuo for 12 h and isolated as a white flocculent solid (6.361 g, 91%).

The polynorbornene was partially hydrogenated by adding polynorbornene (1.0 g, 10.6 mmol) and tosyl hydrazide (2.5 eq.) to a 250 mL round bottom flask equipped with a stir bar. The flask was connected to a reflux condenser which had a stopper affixed at the top and the contents of the flask were evacuated and filled with nitrogen gas three times. While still under nitrogen, anhydrous toluene (100 mL) was added. The mixture was then heated to reflux and reacted for one hour. During this time, the tosyl hydrazide dissolved and the solution turned yellow. Upon cooling to room temperature, the byproducts precipitated out of solution. A partially hydrogenated polymer was precipitated into ethanol (1 liter), filtered, and washed with additional ethanol. The crude polymer was collected and purified via re-precipitation from toluene into ethanol. The product was dried in vacuo for 12 h and isolated as a white flocculent solid (0.746 g, 75%).

To provide a photopatternable polymer, the partially hydrogenated polynorbornene (0.100 g) was placed in a screw-top glass scintillation vial and dissolved in anhydrous p-xylene (1.5% w/v). Any particulates that did not dissolve were filtered out using a 0.45 µm PTFE filter and the solution was concentrated in vacuo to achieve a final concentration of 5% w/v. To this vial was added 1,8-octanedithiol (0.5 eq. relative to the olefin of the polynorbornene) and phenylbis(2, 4,6-trimethylbenzoyl)phosphine oxide (0.025 eq.). The solution was stirred for 10 min and then converted into a free standing film (approx. 20-25 µm) using draw-down technique (36 inch bar). Alternately, the polymer solution was spun-cast onto a silicon wafer (1"×1", ssp) at a rate of 1000 rpm for photopatterning. Residual solvent in the film was evaporated for one hour at RT. The free-standing film was irradiated with UV light for a total exposure of 11,020 mJ/cm$^2$ and subsequently dried in a vacuum oven overnight at 50° C. to provide a cross-linked non-hydrogenated polynorbornene.

Characterization

As described above, the synthesis of polynorbornene was carried out using ROMP with Grubbs' 1$^{st}$ generation catalyst. See R. H. Grubbs, in *Handbook of Metathesis*, Wiley-VCH, Weinheim (2003). The reaction is known to be both facile and high yielding while also allowing for the molecular weight to be controlled simply by varying the catalyst to monomer ratio. Preliminary experiments have shown that a molecular weight (Mw) of ~75,000 was most ideal for the subsequent hydrogenation reactions compared to lower (50,000) and higher (125,000) molecular weights. Thus, normal reaction conditions were employed to yield polynorbornene (quant.) as confirmed by proton nuclear magnetic resonance spectroscopy ($^1$H NMR), and the polymer Mw was measured to be 87,088 relative to narrow molecular weight polystyrene standards using gel permeation chromatography (GPC).

Polynorbornene is a highly unsaturated polymer so it is quite prone to oxidative degradation and inherently limited when it comes to solubility in organic solvents. In an effort to identify the most process-friendly and optimal photopatternable IR matrix material, the olefin content was removed by hydrogenating the polymer to varying degrees. Each hydrogenation reaction was conducted using tosyl hydrazide as the diimide hydrogenation precursor. See F. Cataldo, *Polym. Int.* 34, 49 (1994); and L. A. Mango and R. W. Lenz, *Makromol. Chem.* 163, 13 (1973). The hydrazide undergoes decomposition at elevated temperatures to form diimide (the reactive species) as well as p-toluenesulfinic acid and bis(p-tolyl) disulfide by-products. The advantages of this reaction are that the degree of hydrogenation can be controlled by altering the reaction time or reaction stoichiometry and the by-products can easily be removed during workup by precipitation into ethanol. Furthermore, the degree of hydrogenation is determined using $^1$H NMR by simply integrating the methine peaks between 5-5.5 ppm and the methylene peaks between 0.5-3 ppm.

Figure 2:
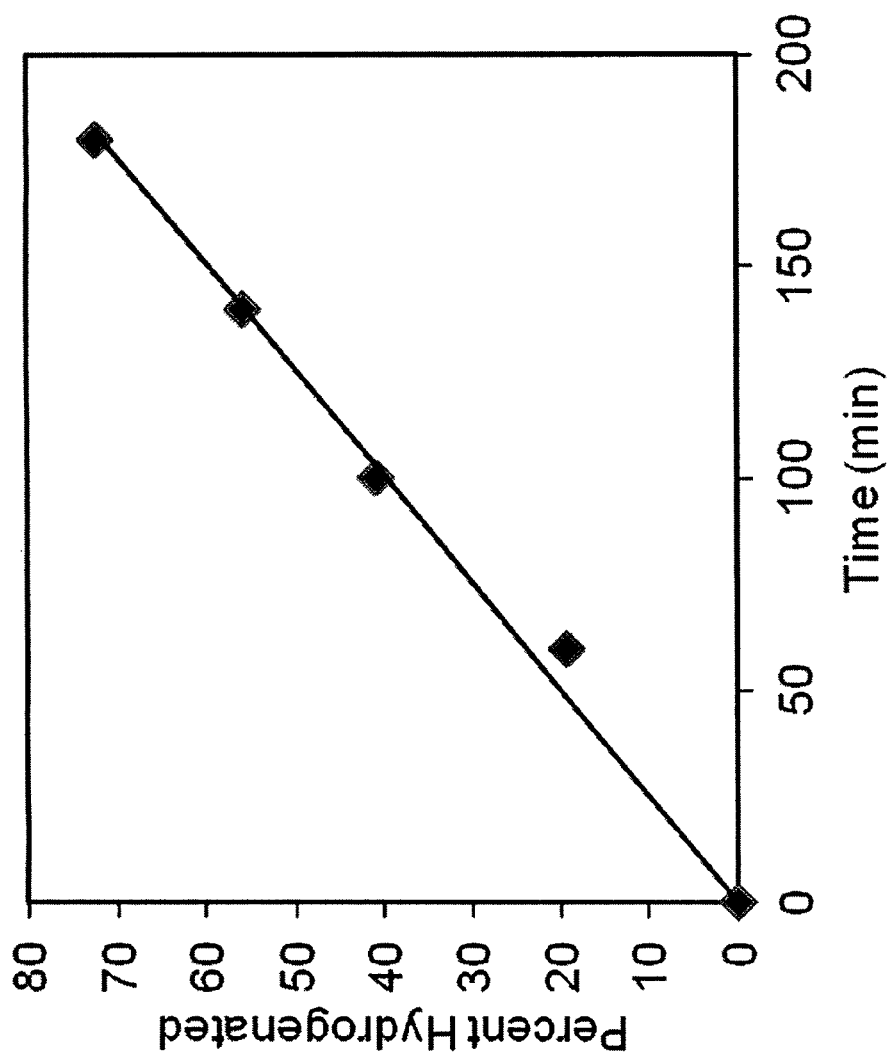
FIG. 2 is a graph of the percent hydrogenated vs. time of polynorbornene.

Several polymer matrix materials were prepared by reacting 2.5 eq. of the hydrogenating agent with polynorbornene for 60-180 min. As shown in FIG. 2, a linear correlation was observed between the percent hydrogenation versus reaction time which was found to be both reproducible and high-yielding. Each of the four partially hydrogenated polynorbornene samples were soluble in nonpolar solvents (toluene, xylene, chloroform) to varying degrees. Partially hydrogenating to 18.2% led to improved solubility over non-hydrogenated polynorbornene but solubility decreased slightly as more olefin was removed (72%). This is probably due to a shift in the amorphous behavior of the polymer as a larger percentage of the olefin is removed. See L. B. W. Lee and R. A. Register, *Macromolecules* 38, 1216 (2005). Nonetheless, the hydrogenated polymer materials were of superior solubility compared to polynorbornene and the reaction time allowed for excellent control of the hydrogenation step.

Each of the partially hydrogenated samples were cross-linked using the thiol-ene reaction. This is a type of click reaction which takes advantage of weak sulfur-hydrogen bonds in thiols and reactive carbon-carbon bonds. See C. E. Hoyle and C. N. Bowman, *Angew. Chem. Int. Edit.* 49, 1540 (2010). On addition of photoinitiator, the reaction proceeds via free radical mechanism to rapidly generate uniform polymer networks in high quantitative yield. In a typical reaction, the partially hydrogenated polymer was dissolved in anhydrous p-xylene (5% w/v) and 1,8-octanedithiol (0.50 eq. relative to the olefin of the polynorbornene) was added as the crosslinker. Prior to adding the cross-linker, the polymer solution was diluted to 1.5%, filtered using a 0.45 µm PTFE filter, and concentrated to 5% w/v in order to removed any undissolved polymer particles. A small amount of bisacylphosphine oxide (BAPO) photoinitiator (0.025 eq) was then mixed into the reaction vial and a free standing film (20-25 µm thick) was cast from this solution using a draw-down technique. All of the films prepared in this manner were subsequently irradiated with a Lighthammer UV conveyer unit (D bulb) to induce cross-linking. Alternatively, irradiation could be carried out using a UV lamp.

The extent of cross-linking was optimized first by measuring the amount of light necesary to crosslink non-hydrogenated polynorbornene via the thiol-ene reaction. A free-standing film approximately 25 µm thick was cast and exposed to UV light at increments of 565 mJ/cm$^2$. The amount of cross-linked olefin was determined using IR analysis by integrating the methine peak (966 cm$^{-1}$) versus the broad methylene peak (2800-3100 cm$^{-1}$). The polymer backbone is comprised of trans double bonds which absorb at 966 cm$^{-1}$ and cis double bonds which absorb at 740 cm$^{-1}$ with the trans being the more predominate of the two. See F. Cataldo, *Polym. Int.* 34, 49 (1994). Though this method is somewhat skewed by the presence of additional methylene groups from the 1,8-octanedithiol, a reasonable correlation was observed in a plot of the percent cross-linked versus exposure power, as shown in FIG. 3A. The majority of the cross-linking occurred within ~5000 mJ/cm$^2$. Beyond this point, cross-linking gradually increased until plateauing at a maximum value of 81%. Additional exposures did not lead to more highly cross-linked films. This is probably due to a lack of mobility and/or alignment of the unreacted olefin and thiol for the thiol-ene reaction. Nonetheless, the optimum amount of power required for maximum cross-linking was identified to be 11,020 mJ/cm$^2$.

Figure 3B:
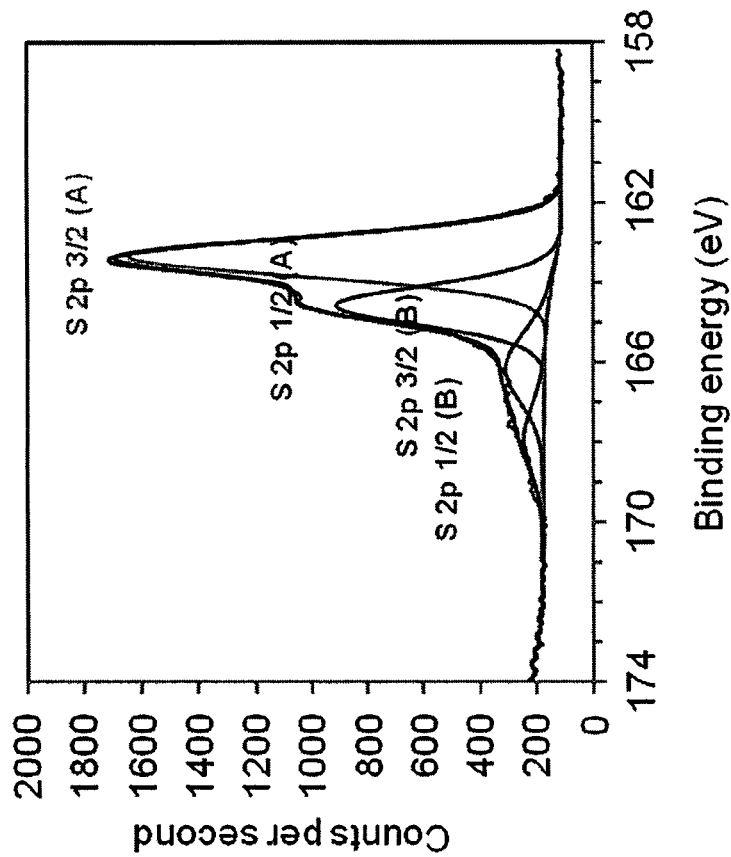
FIG. 3 is a graph of 25 μm thick film cast from a solution containing polynorbornene, 1,8-octanedithiol, and bisacylphosphine oxide (BAPO) exposed to light at different intervals to induce cross-linking (FIG. 3A) and analyzed using x-ray photoelectron spectroscopy (XPS) analysis after cross-linking (FIG. 3B).
Figure 3A:
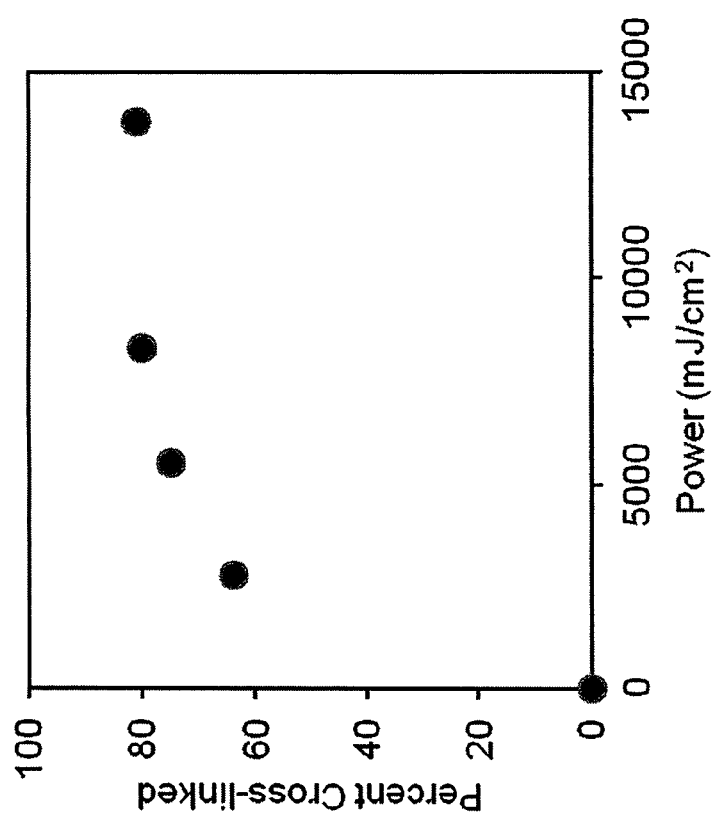

High resolution x-ray photoelectron spectroscopy (XPS) analysis was also used to confirm cross-linking in the exposed sample, as shown in FIG. 3B. Two distinct sulfur environments were observed with the primary component assigned as bound sulfur ($S_{2p3/2}$ binding energy of 163.4 eV) and a smaller secondary component assigned as that of unbound sulfur ($S_{2p3/2}$ binding energy of 166.2 eV). See D. G. Castner et al., *Langmuir* 12, 5083 (1996). The ratio of bound versus unbound is consistent with the IR data and suggests that, though a minimal amount of unbound thiol remained in the film due to incomplete cross-linking, the majority reacts to form new sulfur-carbon linkages via the thiol-ene reaction thereby eliminating most of the olefin absorption in the 8-12 µm spectral region.

Figure 4A:
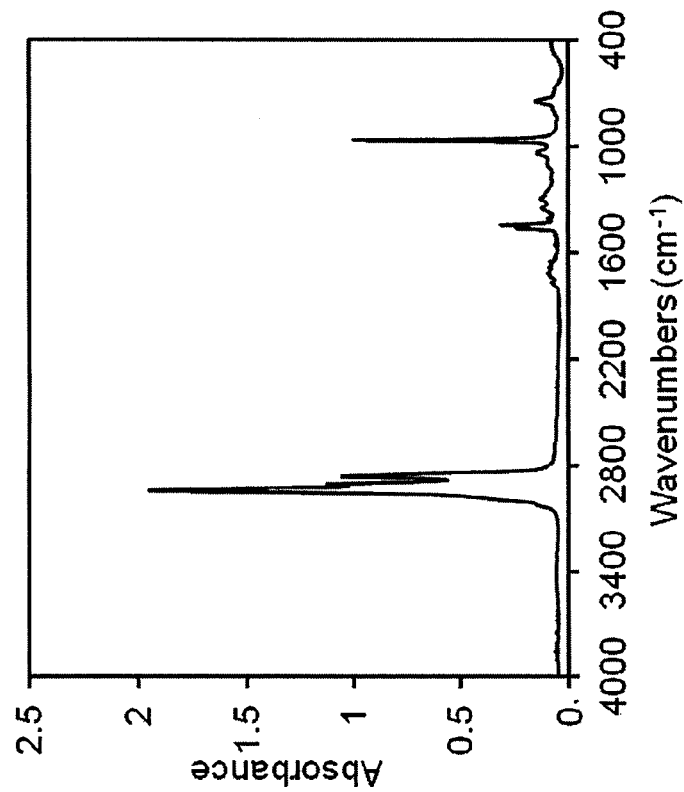
FIG. 4 is a graph of Fourier transfrom infrared (FTIR) spectra for free-standing films (20-25 μm thick) consisting of partially hydrogenated polynorbornene (18.2%) before and after cross-linking (FIG. 4A and FIG. 4B, respectively).
Figure 4B:
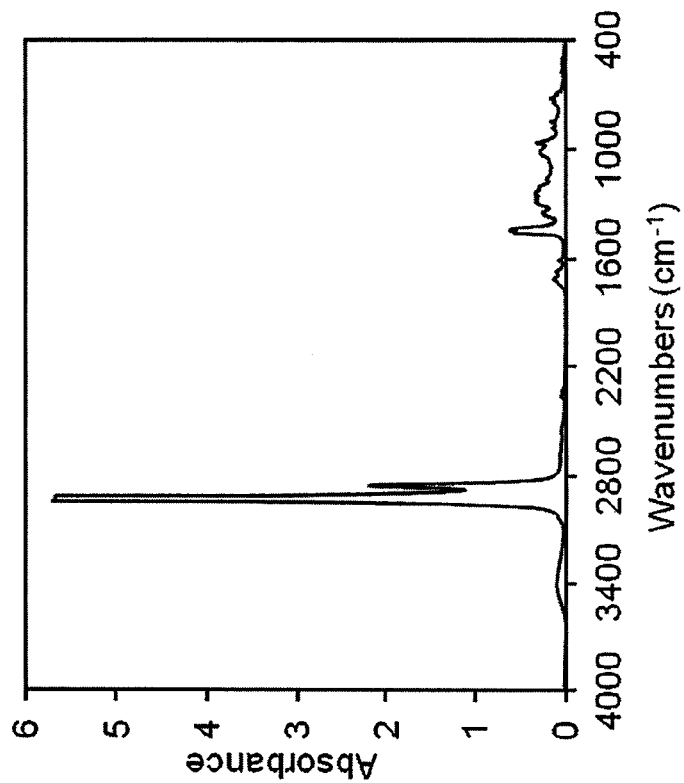

The partially hydrogenated polymers should be more amenable to LWIR-metamaterial applications because of the lower IR-absorbing olefin content and good solubility. The remaining olefin can be reduced even further via the thiol-ene reaction to yield materials that are not only more optically favorable, but thermally favorable as well. To demonstrate this, two free-standing films were cast for each partially hydrogenated polymer. One of the films was subjected to the thiol-ene reaction whereas the second film was a control which contained only the partially hydrogenated pre-polymer. IR analysis was carried out on each of the films to reveal that olefin absorbance had in fact decreased in the cross-linked films. For example, a considerable reduction in the methine peak at 966 cm$^{-1}$ was observed for an irradiated film prepared from partially hydrogenated (18.2%) polynorbornene, as shown in FIGS. 4A and 4B.

TABLE 1

Influence of the thiol-ene coupling reaction on the $T_g$

| Entry | Percent Hydrogenated | $T_g$ [° C.]$^a$ | Cross-linked? |
|---|---|---|---|
| 1 | 0 | 44 | |
| 2 | 0 | 115 | X |
| 3 | 18.2 | 34 | |
| 4 | 18.2 | 49, 101 | X |
| 5 | 41 | 36 | |
| 6 | 41 | 42, 95 | X |
| 7 | 55.9 | 23 | |
| 8 | 55.9 | 35, 71 | X |
| 9 | 72.4 | 27 | |
| 10 | 72.4 | 27, 54 | X |

$^a$Measured using DMA analysis for the free-standing films (20-25 µm). The value was recorded from the peak of the tan delta.

The thermo-mechanical properties of the films were characterized next using dynamic mechanical analysis (DMA). See L. E. Nielsen and R. F. Landel, *Mechanical Properties of Polymers and Composites*, Marcel Dekker, New York, 1994. The cross-linked materials should be more thermally stable than their non cross-linked counterparts due to an increase in density within the polymer matrix. Indeed, the $T_g$ temperatures for the control films were low (23-44° C.) compared to those cross-linked using the thiol-ene reaction ($T_g$=54-115° C.). Cross-linked polynorbornene was found to be the most thermally stable of all the exposed films ($T_g$=115° C.), whereas films prepared from more extensively hydrogenated polynorbornene showed only a marginal increase in $T_g$. This is best explained by the lower availability of olefin in the extensively hydrogenated polymer. In most cases, two tan delta peaks were observed which is attributed to a small amount of unreacted olefin. Considering the DMA results along with the FTIR data, the least hydrogenated polynorbornene sample (18.2%) appears to be the optimum material for LWIR-metamaterial applications as it provides an excellent combination of solubility, thermal stability, and minimized absorption in the 8-12 µm spectral region.

Figures 5A, 5B:
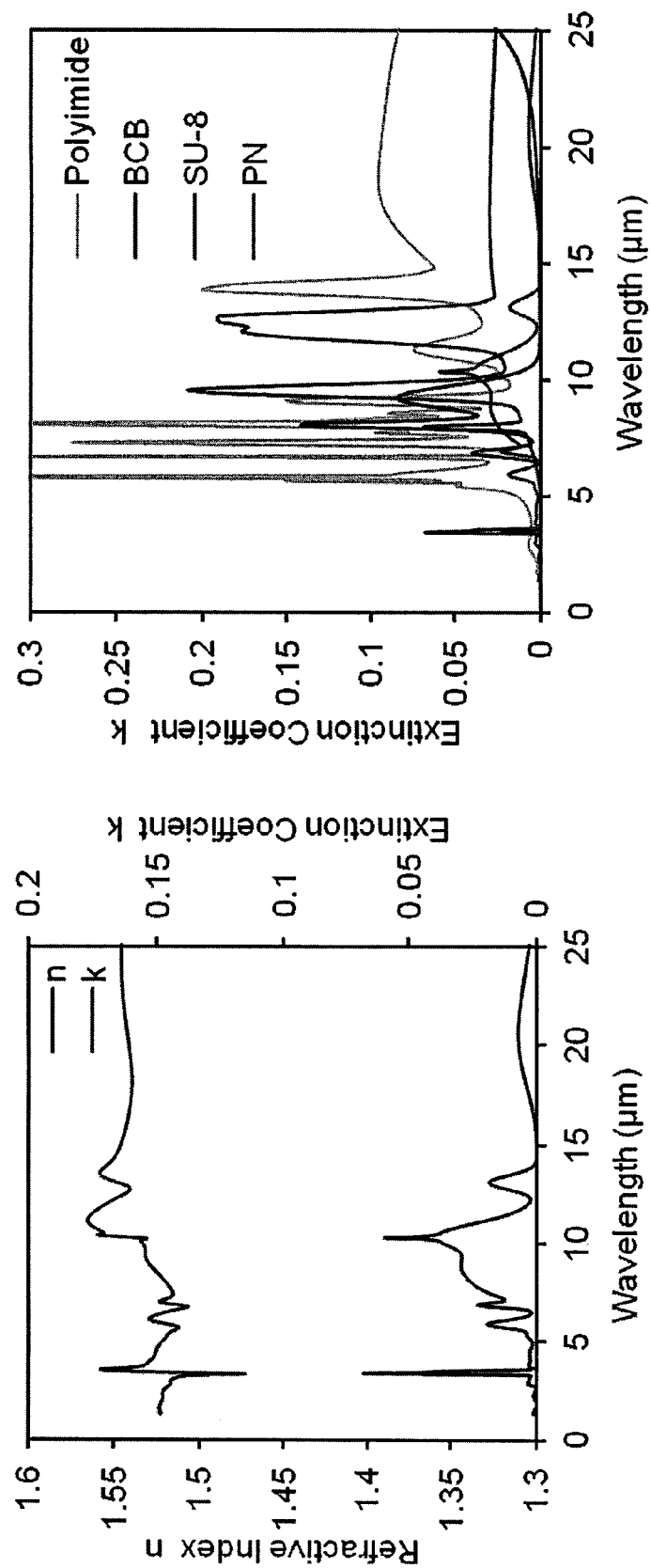
FIG. 5A is a graph of the experimentally measured complex refractive index and extinction coefficient for partially hydrogenated polynorbornene (18.2%) cross-linked using the thiol-ene reaction.
FIG. 5B is a graph of the extinction coefficient for the cross-linked polynorbornene (PN), benzocyclobutene (BCB), SU-8 photoresist, and polyimide. The extinction coefficient for the cross-linked polynorbornene sample is signifcantly less than that of other commercially available photoresists that have been cross-linked.

An infrared variable angle spectral ellipsometer (IR-VASE) was used to measure the frequency-dependent complex index of refraction for partially hydrogenated polynorbornene (18.2%) that was cross-linked via the thiol-ene reaction. Extraction of the optical properties was carried out via a general thin-film measurement procedure previously described by Woollam et al. See J. A. Woollam et al., *SPIE Proc. CR*72, 3 (1999). The polymer was first spun onto a substrate consisting of a 1 inch square of 380 µm thick silicon coated with an optically-thick layer of aluminum. The aluminum layer was required to prevent the polymer film from acting as an anti-reflective coating for the bare silicon. The IR-VASE was fixed to an operating spectral range of 2-25 µm and angle of incidences of 55 degrees to 70 degrees with a step size of 5 degrees. The measured ellipsometric constants, ψ and Δ, were fit to a series of Gaussian oscillators centered at energies corresponding to the film's vibrational modes using Wollam's WVASE software. See D. D. Meneses et al., *J. Non-Cryst. Solids* 352, 5301 (2006). Extracted optical properties are shown in FIG. 5A for a 1.645 µm thick spin-cast film. The measured loss over the integrated 8-12 µm is significantly less than comparable polymers typically used in microfabrication such as polyimide and benzocyclobutene based polymer (BCB), as shown in FIG. 5B. See W. R. Folks et al., *Phys. Status Solidi* 5, 1113 (2008).

Photopatterning

Figure 6:
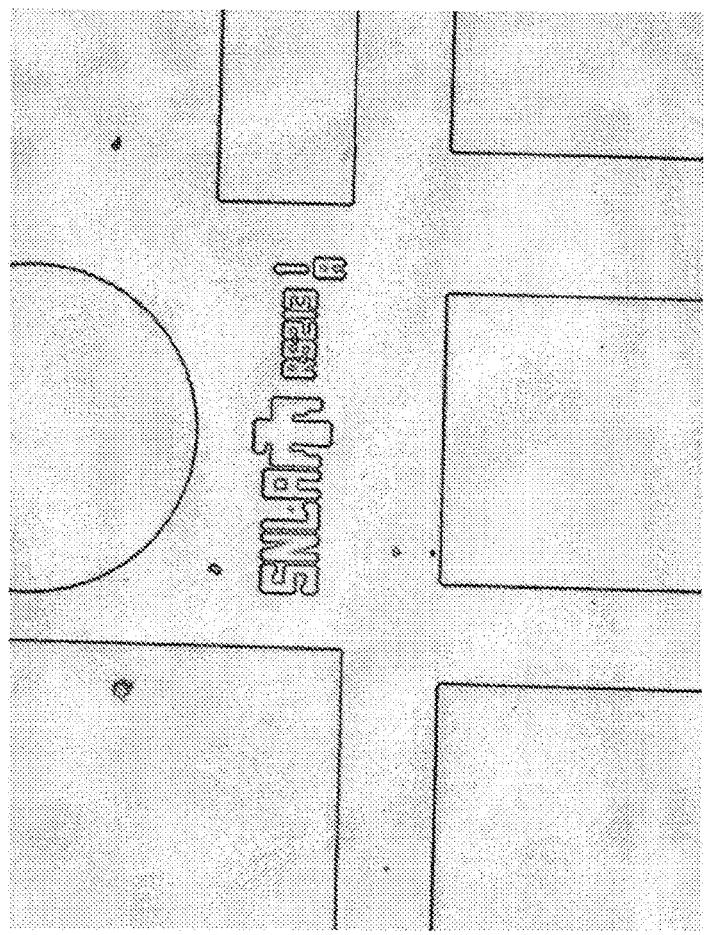
FIG. 6 is an optical microscope image of photopatterned low loss LWIR-metamaterial matrix.

The optimal polymer material was tested next for microfabrication compatability. Preliminary experiments determined that an adhesion layer was required to ensure that thick films (>1 µm) remained adhered to the silicon substrate during UV exposure. The adhesion layer was deposited by spin casting a layer of non-hydrogenated polynorbornene containing dithiol and photocross-linking via thiol-ene reaction to generate a thin film (28 nm). Next, a solution of partially hydrogenated polynorbornene (18.2%), cross-linker, and photoinitiator was prepared under the same conditions used to make the free-standing films and spun cast onto the wafer. The film was irradiated (405 nm, 20 mW/cm$^2$) using a mask aligner at a total power of 6,000 mJ/cm$^2$. The film was then developed in toluene for 5 minutes to remove the non cross-linked polymer and maintain the exposed regions. Though development in toluene was somewhat difficult to observe since the polymer and toluene have a similar index of refraction ($n_D$=1.5), photopatterned structures with well-refined micron-sized features were evident throughout the film, as shown in FIG. 6.

Dielectric Resonator Loss

Figure 7B:
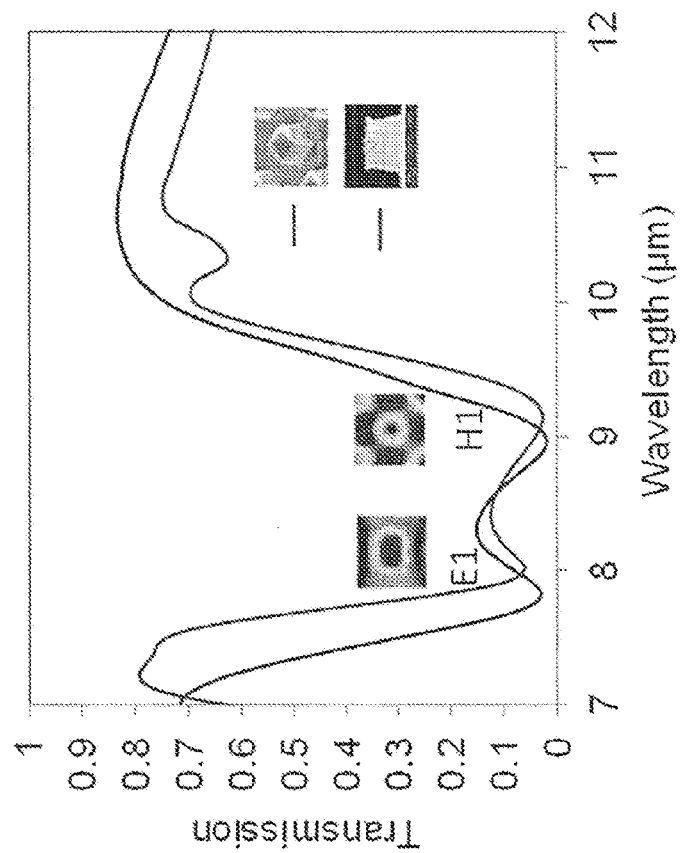
FIG. 7B is a graph of transmission spectra for the same metamaterial before and after adding the optimum polymer material. The polymer, shown in black in the SEM has a flat surface and planarizes well over etched tellurium cubes. Though the electric resonance (E1) and magnetic resonance (H1) shifts to a slightly higher wavelength when the polymer is present, there is minimal attenuation of the resonant fields overall.
Figure 7A:
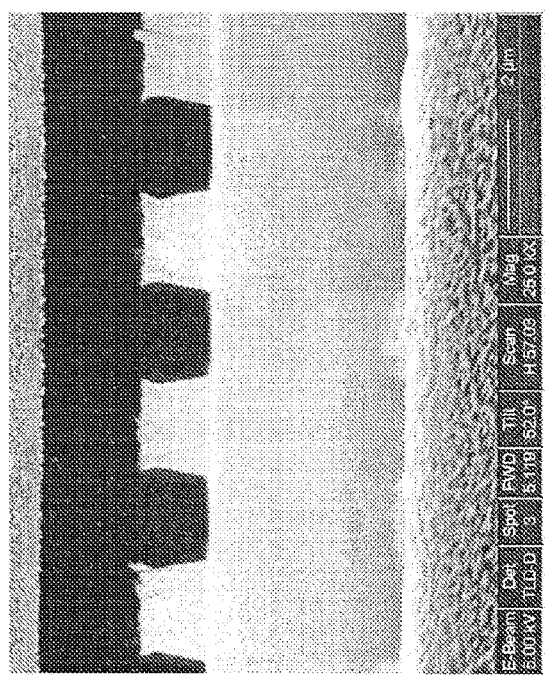
FIG. 7A is a cross-section view of an all-dielectric infrared metamaterial taken using scanning electron microscopy (SEM).

The impact of the optimum polymer material on the overall loss of an all-dielectric, infrared metamaterial was evaluated next. The fabrication of the metamaterial is described in J. C. Ginn et al., submitted to *Phys. Rev. Lett.* Briefly, an optically thick layer of tellurium (1.7 µm) was deposited on a barium fluoride substrate and patterned using standard e-beam lithography and a reactive ion etching process. The optimum partially hydrogenated polymer was spun-cast onto the etched tellurium wafer and photochemically cross-linked using the thiol-ene reaction. FIG. 7A is a cross-section image of the wafer taken using scanning electron microscopy (SEM) showing that the polymer had good planarization and flat-top surface behavior. More importantly, the polymer had little impact on the overall loss of the metamaterial as transmission spectra collected both in the absence and presence of polymer were marginally different, as shown in FIG. 7B. As expected, the addition of the polymer to the wafer led to an upward shift in wavelength for both electric and magnetic resonances. This is due to an overall increase in the permittivity/refractive index of the resonator system. Finally, an absorption feature was observed at 10.3 µm which is consistent with the peak in the measured extinction coefficient for blanket polynorbornene film. This peak is associated with a small amount of unreacted olefin remaining in the polymer. Ultimately, though, the polymer had little influence on the overall metamaterial loss due to a lack of strong absorptions in the 8-12 µm spectral range. This is in contrast to commercially available photopatternable polymers that have much higher losses. See J. C. Ginn et al., in *OSA Technical Digest*, Optical Society of America, Tuczon, Ariz., p. MWD2. (2010); and W. R. Folks et al., *Phys. Status Solidi* 5, 1113 (2008).

The present invention has been described as polymeric matrix materials for infrared metamaterials. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method of synthesis a low-loss polymeric matrix material for infrared metamaterials, comprising:
   providing an unsaturated polymer, comprising double or triple bonds;
   partially hydrogenating the unsaturated polymer;
   depositing a film of the partially hydrogenated polymer and a crosslinker on a substrate; and
   photopatterning the film by exposing a portion of the film to ultraviolet light through a patterning mask, thereby cross-linking at least some of the remaining unsaturated groups of the partially hydrogenated polymer in the exposed portion.

2. The method of claim 1, wherein the unsaturated polymer comprises polynorbornene.

3. The method of claim 2, wherein the step of providing polynorbornene comprises a ring opening metathesis polymerization of norbornene.

4. The method of claim 2, wherein the step of partially hydrogenating the polynorbornene comprises hydrogenating at least some of the olefin groups of the polynorbornene using tosyl hydrazide as a diimide hydrogenation precursor.

5. The method of claim 2, wherein the cross-linking comprises a thiol-ene coupling reaction.

6. The method of claim 5, wherein the thiol-ene coupling reaction uses octanedithiol as a crosslinker.

7. The method of claim 5, wherein the thiol-ene coupling reaction further comprises using bisacylphosphine as a photoinitiator.

8. The method of claim 1, further comprising developing the photopatterned film.

9. The method of claim 1, wherein the unsaturated polymer comprises polybutadiene.

10. The method of claim 9, wherein the cross-linking comprises a thiol-ene coupling reaction.

\* \* \* \* \*